United States Patent
Henson et al.

(10) Patent No.: US 7,297,618 B1
(45) Date of Patent: Nov. 20, 2007

(54) FULLY SILICIDED GATE ELECTRODES AND METHOD OF MAKING THE SAME

(75) Inventors: William K. Henson, Peekskill, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/460,762

(22) Filed: Jul. 28, 2006

(51) Int. Cl.
H01L 21/28 (2006.01)
(52) U.S. Cl. .............. 438/581; 438/285; 257/377; 257/285; 257/E21.439
(58) Field of Classification Search .......... 257/377, 257/E21.439; 438/285, 581
See application file for complete search history.

(56) References Cited

U.S. PATENT DOCUMENTS

| | | | |
|---|---|---|---|
| 6,599,831 B1 | 7/2003 | Maszara et al. | |
| 6,846,734 B2 | 1/2005 | Amos et al. | |
| 7,078,347 B2 * | 7/2006 | Mehrad et al. | 438/696 |
| 2004/0009652 A1 * | 1/2004 | Chung | 438/592 |
| 2004/0094804 A1 * | 5/2004 | Amos et al. | 257/369 |

* cited by examiner

*Primary Examiner*—Jerome Jackson
*Assistant Examiner*—Mohammed Timor Karimy
(74) *Attorney, Agent, or Firm*—Yuanmin Cai

(57) ABSTRACT

The present invention relates to a method of selectively fabricating metal gate electrodes in one or more device regions by fully siliciding (FUSI) the gate electrode. The selective formation of FUSI enables metal gate electrodes to be fabricated on devices that are compatible with workfunctions that are different from conventional n+ and p+ doped poly silicon electrodes. Each device region consists of at least one Field Effect Transistor (FET) device which consists of either a polysilicon gate electrode or a fully silicided (FUSI) gate electrode. A gate electrode comprised of silicon and a Ge containing layer is used in combination with a selective removal process of the Ge containing layer. The Ge containing layer is not removed on devices with threshold voltages that are not compatible with the FUSI workfunction. Devices that are compatible with the FUSI workfunction have the Ge containing layer removed prior to the junction silicidation step. The remaining thin silicon layer of the gate electrode becomes fully silicided during the same step as the junction silicidation step.

27 Claims, 4 Drawing Sheets ize of threshold voltage by around 250 mV to 500
FULLY SILICIDED GATE ELECTRODES AND METHOD OF MAKING THE SAME

FIELD OF THE INVENTION

The present invention relates to manufacture of semiconductor devices. In particular, it relates to method of making fully silicided gate electrodes for field-effect-transistors.

BACKGROUND OF THE INVENTION

It is well known in the art that polysilicon may be used as gate electrode in semiconductor devices such as, for example, field-effect-transistors (FETs) and in particular complementary metal-oxide-semiconductor field-effect-transistors (CMOS-FETs). On the other hand, with the continuing scaling down in dimensions of semiconductor devices, other types of gate electrodes such as, for example, metal and/or fully silicided (FUSI) gate electrodes are being used to replace the conventional polysilicon gate electrodes. Metal and/or FUSI gate electrodes may reduce and/or prevent depletion of charges, commonly known as poly-depletion, associated with polysilicon gate electrode. Occurring in the vicinity of an interface between a polysilicon gate electrode and a gate dielectric, poly-depletion may lead to less induced charges in the channel region of a FET device causing lower current and degraded performance. Compared with using polysilicon gate electrodes, the use of metal and/or FUSI gate electrodes may reduce an effective thickness of the gate dielectric, and thus increase the capacitance associated with the gate, or gate capacitance. The increase in gate capacitance effectively increases the amount of induced charges in the channel region of the FET device, which translates to higher drive currents and transistor performance.

On the other hand, there are situations where it may be difficult to use metal gate electrodes in certain device areas having devices with multiple threshold voltages. Metal gate and/or FUSI gate electrodes tend to have workfunctions near the mid-gap of silicon. Workfunctions near the mid-gap of silicon lead to higher than desirable threshold voltages. The standard way to reduce threshold voltage is to decrease the channel doping of the device; however, this leads to degraded short channel control. The net result is that metal gate electrodes with workfunctions near the mid-gap of silicon do not have a device design point for FETs with a low threshold voltage.

It is also known in the art that when FUSI is performed on a highly doped n+ polysilicon of a FET gate (nFET), the resultant FUSI gate electrode may have a workfunction value that is operational. However, performing FUSI on a FET gate with highly doped p+ polysilicon (pFET) may not necessarily create a workfunction value that is compatible or desirable for the intended devices.

For instance, with some state of the art FET devices, the magnitude of threshold voltages with highly doped n+ polysilicon electrodes may range from, for example, 0.15V-0.55 V depending upon the type of technology used. A threshold voltage is known to determine when a CMOS-FET turns on and/or off. Lower magnitudes of threshold voltage may create a FET with higher current and high power consumption while higher magnitudes of threshold voltage may result in a FET with lower current and lower power consumption. For example, magnitude of threshold voltage for a high performance device may be as low as 0.15V while for low power devices the threshold voltage may be as high as 0.55V. In general, multiple-threshold voltages are needed in semiconductor technology to provide flexibility in design for low-power, high-performance, and mixed-signal applications.

Applying FUSI using known methods may increase the magnitude of threshold voltage by around 250 mV to 500 mV due to changes in the workfunction of the gate electrode. This increase in threshold is often not desirable for FET devices that require low magnitudes of threshold voltage to achieve high performance. It is possible to apply FUSI to a FET device while maintaining a desired magnitude of threshold voltage by, for example, decreasing a doping concentration in a channel region of the substrate. This is because decreasing the channel doping may decrease the magnitude of the threshold voltage, countering the increase due to the application of FUSI. Nevertheless, decreasing the channel doping to a critical level may create a FET that does not function properly. If the substrate doping is too low then the source/drain regions may form a short circuit that may no longer be controllable by the gate electrode. This could lead to a FET that cannot be turned off and thus becomes useless. Specifically, FETs with already low magnitudes of threshold voltages (0.15V-0.25V) are not compatible with current state of the art FUSI. Using FUSI gate electrodes on these devices would result in FETs that cannot be turned off due to the reduction of substrate doping required in order to achieve the desired low magnitude of threshold voltage. However, FETs that have threshold voltages in the 0.3V-0.55V range are compatible with FUSI gate electrodes because the substrate doping is relatively high for these FETs when polysilicon gate electrodes are used. Using FUSI gate electrodes on FETs with threshold voltages in the range of 0.3V-0.55V may be achieved by decreasing the substrate doping to account for the 250 mV-500 mV increase caused by the change in FUSI gate electrode workfunction.

BRIEF DESCRIPTION OF THE DRAWINGS

The present invention will be understood and appreciated more fully from the following detailed description of the invention, taken in conjunction with the accompanying drawings of which.

Figure 1:
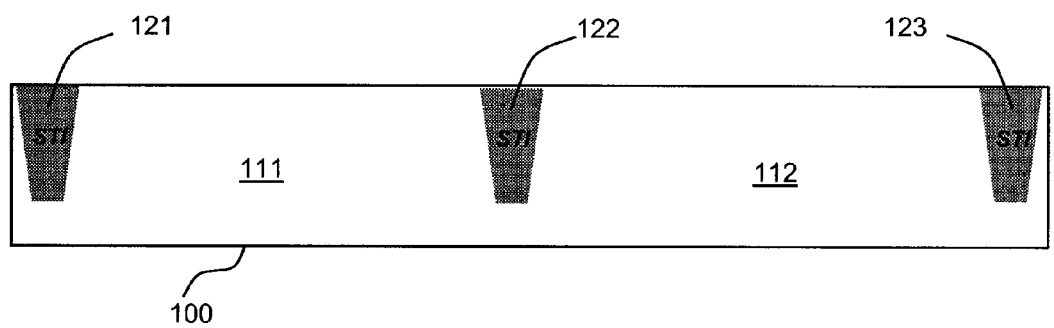
FIGS. 1-8 are simplified illustrations of methods of selectively forming fully silicided gate electrodes according to various embodiments of the invention.

It will be appreciated that for simplicity and clarity of illustration, elements shown in the drawings have not necessarily been drawn to scale. For example, the dimensions of some of the elements may be exaggerated relative to other elements for clarity.

SUMMARY OF THE INVENTION

There is a need to form fully silicided gate electrodes selectively on a semiconductor device. The present invention provides a method of forming fully silicided (FUSI) gate electrodes in selected device regions of an integrated circuit. For example, the present invention may enable FUSI gate electrodes be selectively formed on FET gate devices that require threshold voltages of a workfunction in 0.3V-0.5V range, where FUSI induced increase in threshold voltage may be accommodated by reduction in doping density of the substrate, while avoiding formation of FUSI gate electrode in other devices where FUSI is not desirable due to, for example, already low threshold voltage. In addition, the present invention forms FUSI gate electrodes during a source/drain silicidation process. The use of FUSI gate electrode may possibly reduce or eliminate the gate depletion and therefore increases the current drive of transistors.

One embodiment of the invention provides a method for selectively forming fully silicided (FUSI) gate electrode on gate dielectric. The method includes forming first and second sets of gate devices on a substrate; covering one or more of the first set of gate devices with a protective masking layer; removing selectively a Ge-containing silicon layer in a gate stack of one or more of the second set of gate devices to expose a silicon layer formed directly on top of a gate dielectric layer; removing the protective masking layer on the one or more first set of gate devices; covering the first and second sets of gate devices, including the exposed silicon layer, with a metal-containing layer; and annealing the first and second sets of gate devices to form selectively FUSI gate electrode directly on top of the gate dielectric layer of the one or more second set of gate devices.

According to one embodiment, the annealing includes subjecting the first and second sets of gate devices to a high temperature environment of about 400° C. to about 900° C., preferably from about 420° C. to about 700° C., a gas ambient including He, Ar, or $N_2$, and to a process of rapid thermal annealing, spike annealing, or laser annealing in a time period from about 1 second to about 120 seconds. The silicon layer forming the FUSI gate electrode has a thickness in the range from about 10 nm to about 50 nm, and preferably between about 15 nm and about 30 nm.

According to another embodiment, the annealing also includes siliciding the source/drain regions of the first and second sets of gate devices, and at most a portion of a Ge-containing silicon layer in a gate stack of the one or more first set of gate devices.

Another embodiment of the invention provides a method for forming (FUSI) gate electrode for one or more n-type FETs (field-effect-transistors) on a semiconductor substrate, the semiconductor substrate includes one or more p-type FETs. The method includes covering the one or more p-type FETs with a protective masking layer; removing a Ge-containing silicon layer in a gate stack of the one or more n-type FETs to expose a silicon layer formed directly on top of a gate dielectric layer of the one or more n-type FETs; removing the protective masking layer on the one or more p-type FETs; covering the one or more p-type and n-type FETs, including the exposed silicon layer of the one or more n-type FETs, with a metal-containing layer; and annealing the one or more p-type and n-type FETs to form selectively the FUSI gate electrode directly on top of the gate dielectric layer of the one or more n-type FETs.

Yet, another embodiment of the invention provides a semiconductor device that includes one or more p-type field-effect-transistors (FETs) and one or more n-type FETs, wherein at least one of the n-type FETs includes a fully silicided (FUSI) gate electrode formed directly on top of a gate dielectric, the FUSI gate electrode having a thickness in the range between about 10 nm and about 50 nm, and wherein the one or more p-type FETs includes at most partially silicided gate electrode.

DETAILED DESCRIPTION OF THE INVENTION

In the following detailed description, numerous specific details are set forth, such as particular structures, components, materials, dimensions, processing steps and/or techniques, in order to provide a thorough understanding of the present invention. However, it will be appreciated by a person of ordinary skill in the art that the present invention may be practiced without these specific details. In other instances, well-known structures and/or processing steps may not have been described in detail in order to avoid obscuring the description of the invention.

The present invention provides a method of forming fully silicided (FUSI) gate electrodes in selected device regions of an integrated circuit. For example, the present invention may enable FUSI gate electrodes be selectively formed on FET gate devices that require threshold voltages in the 0.3V-0.5V range, where FUSI induced increase in threshold voltage may be accommodated by reduction in doping density of the substrate, while avoiding formation of FUSI gate electrode in other devices where FUSI is not desirable due to, for example, much lower threshold voltage. In addition, the present invention forms FUSI gate electrodes during a source/drain silicidation process. The use of FUSI gate electrode may possibly reduce or eliminate gate depletion and thus increases the drive current of transistors such as field-effect-transistors (FETs).

FIG. 1 is a simplified illustration of a method of selectively forming fully silicided gate electrodes according to one embodiment of the invention. A semiconductor substrate 100 may be provided that may include two device regions such as, for example, device regions 111 and 112. Other numbers of device regions may be used. A device region may be a region or area of a substrate pre-determined or pre-allocated whereon at least one semiconductor device may be formed. Different device regions, e.g., device regions 111 and 112, may be distinguished by the types of devices to be formed subsequently thereon as well as the types of dopants associated with the devices to be implanted therein. For example, a p+ type dopant may be implanted in device region 111 to form a region of substrate thereon a p-type FET (pFET) device, which uses holes as charge carriers, may be formed or produced. Similarly, an n+ type dopant may be implanted in device region 112 to form a region of substrate thereon an n-type FET (nFET) device, which uses electrons as charge carriers, may be formed or produced.

According to one embodiment of the invention, full silicidation (FUSI) of gate electrodes may be performed or conducted selectively on certain types of devices. For example, FUSI may be performed on an nFET device, which is to be formed in device region 112, but not on a pFET device, which is to be formed in device region 111, as described below in detail with reference to FIGS. 4-8. It will be appreciated by a person skilled in the art that in FIG. 1, device regions 112 and 111 (one to perform FUSI and the other not) are for illustration purpose, and the present invention may be selectively applied to any device or device region(s). For example, FUSI may be performed in device region 111 but not in device region 112. In addition, device region 111 may be a region where nFET device(s) may be formed, instead of pFET device(s), and device region 112 may be a region where pFET device(s) may be formed, instead of nFET device(s).

Materials of substrate 100 may include any types of semiconductors such as, for example, Si, SiGe, SiGeC, SiC, Ge alloys, GaAs, InAs, InP and other III/V or II/VI compound semiconductors. Substrate 100 may also include layered semiconductors such as, for example, Si/SiGe, Si/SiC, silicon-on-insulators (SOIs) or silicon germanium-on-insulators (SGOIs). Substrate 100 may be doped, undoped or contain both doped and undoped regions therein, and may be strained, unstrained or contain both strained and unstrained regions therein. Furthermore, substrate 100 may have a single crystal orientation or may be a hybrid semiconductor substrate having different crystal orientations.

According to one embodiment, device regions 111 and 112, for example, may be electrically isolated from each other by one or more field oxide isolation regions and/or shallow trench isolation (STI) regions formed within substrate 100. For example, STI regions 121, 122, and 123 may be formed or created to define device regions 111 and 112. The creation or formation of STI regions 121, 122, and 123 may be through well-known semiconductor processing technologies. For example, STI regions 121, 122, and 123 may be formed through a combination of steps of lithography and etching to first create trench openings in substrate 100, subsequently fill the openings with trench dielectric, for example oxide, through a chemical vapor deposition (CVD) process, and then planarize the surface of substrate 100 through for example a chemical mechanical planarization (CMP) process.

Figure 2:
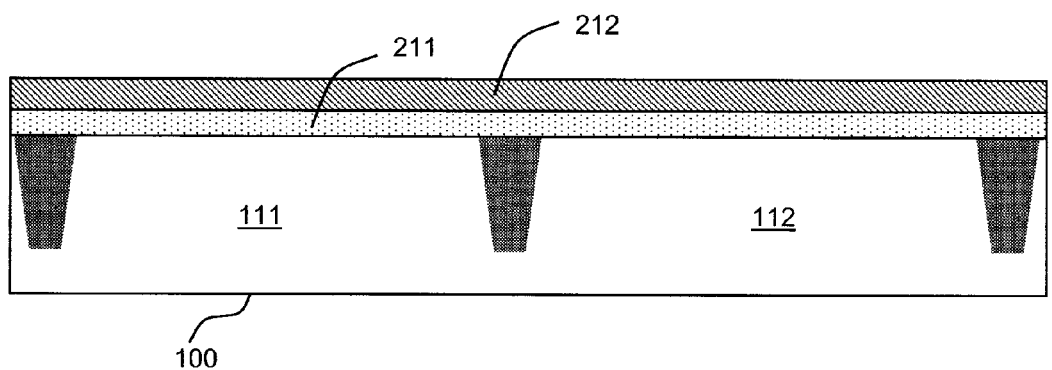

FIG. 2 is a simplified illustration of a method of selectively forming fully silicided gate electrodes according to another embodiment of the invention. Following the formation of STI regions 121, 122, and 123 as illustrated in FIG. 1, a layer of gate dielectric 211 may be formed on top of substrate 100 that covers device regions 111 and 112. Gate dielectric 211 may be formed following well-known processes such as oxidation, CVD and/or plasma-assisted CVD, atomic layer and/or pulsed deposition (ALD or ALPD), evaporation, reactive sputtering, chemical deposition or other like processes and/or combinations thereof.

Gate dielectric 211 may be formed to have a thickness ranging from 1 to 3 nanometers (nm). Although a thickness of gate dielectric 211 around 1 nm is typical and/or more preferred, the invention is not limited in this respect and other thickness may be used. Materials of gate dielectric 211 may include, for example, silicon dioxide $SiO_2$, silicon oxynitride SiON, $HfO_2$, HfSiON and other materials that may be suitable for the gate as they are known in the art.

According to one embodiment, a thin layer of silicon 212 may be subsequently formed directly on top of gate dielectric layer 211. The formation of silicon layer 212 may be through, for example, CVD or other well-known and suitable semiconductor processes. According to one embodiment, silicon layer 212 may be deposited to have a thickness ranging from 10 nm to 50 nm and a range of 15 nm to 30 nm is generally preferred. Other thickness of silicon layer 212 may be used as well.

Figure 3:
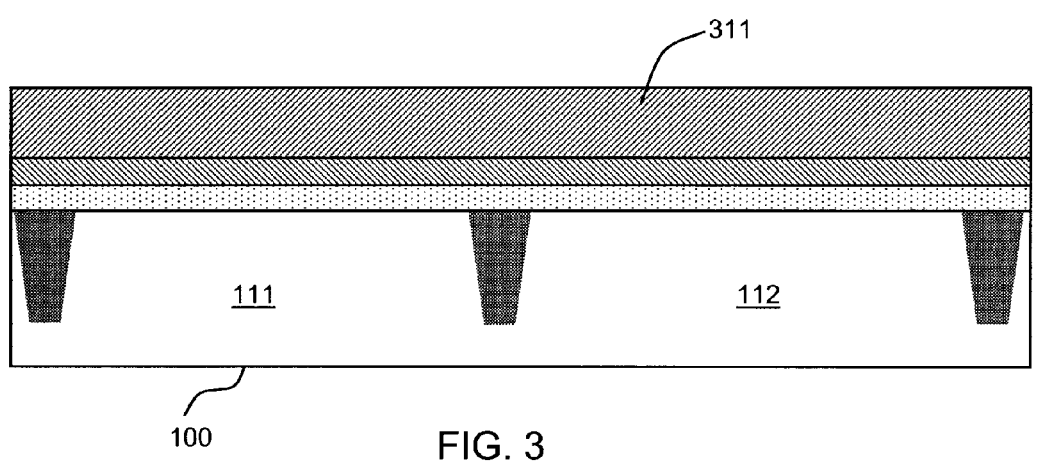

FIG. 3 is a simplified illustration of a method of selectively forming fully silicided gate electrodes according to yet another embodiment of the invention. Following the formation of silicon layer 212 as illustrated in FIG. 2, a layer of Ge-containing semiconductor layer 311 may be deposited on top of silicon layer 212. Concentration of Ge in semiconductor layer 311, which may be a silicon alloy layer of SiGe for example, may be relatively high in the range of 15 to 50 atomic percent and preferably in the range from about 30 to about 40 atomic percent. However, the present invention is not limited in this respect and other levels of Ge concentration such as, for example, a concentration of up to 99 atomic percent may be used. It is noted that the above concentration levels of Ge in the Ge-containing layer 311 may ensure that the Ge-containing layer 311 may be etched away, in a subsequent selective etching process, as compared to the underlying silicon layer 212. According to one embodiment, the thickness of the Ge-containing layer 311 may range from 50 nm to 100 nm with a preferred range from 70 nm to 85 nm. Other thickness of Ge-containing layer 311 may be used. In addition, the SiGe alloys may be single-crystal, amorphous or polycrystalline, with polycrystalline being highly preferred.

Figure 4:
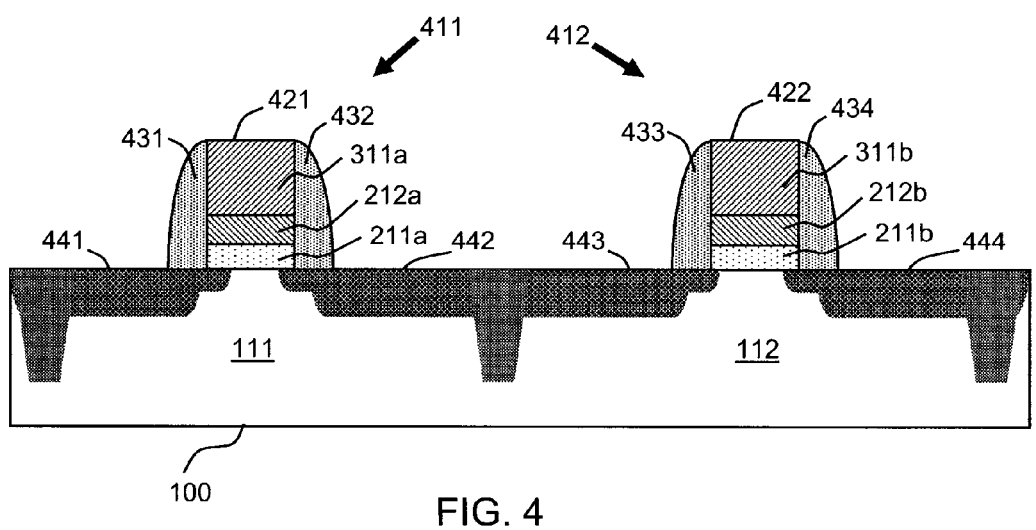

FIG. 4 is a simplified illustration of a method of selectively forming fully silicided gate electrodes according to a further embodiment of the invention. Following the formation of Ge-containing silicon layer 311 as illustrated in FIG. 3, at least one gate device is formed in each device region. For example, a pFET gate device 411 in device region 111 and an nFET gate device 412 in device region 112 may be formed. The formation of gate devices 411 and 412 may be through a combination of well-known semiconductor processing techniques for CMOS including, but not limited to, photo-lithography, etching, and deposition. A photo-lithography process may include steps of, for example, applying a photoresist material to the Ge-containing layer 311, exposing the photoresist material to a pattern of radiation, and developing the exposed photoresist in a conventional resist developer to make a photo-mask (not shown). After forming the photo-mask to protect gate stacks 421 and 422 which may include a portion of Ge-containing layer 311, silicon layer 212, and gate dielectric layer 211, the rest of layers 311, 212, and 211 in areas not protected by the photo-mask may be etched away. As a result, gate stack 421 may be formed to include Ge-containing layer 311a, silicon layer 212a, and gate dielectric layer 211a, and gate stack 422 may be formed to include Ge-containing layer 311b, silicon layer 212b, and gate dielectric layer 211b.

The etching may typically be performed utilizing a dry etching process such as a reactive-ion-etching (RIE), ion beam etching, or plasma etching, to name a few. However, the invention is not limited in this respect and other etching processes and/or methods such as a chemical wet etching process may be used. After forming gate stacks 421 and 422, spacers, such as spacers 431, 432, 433 and 434, may be formed on exposed sidewalls of the patterned gate stacks through processes such as a CVD deposition process followed by an etching process. Material of spacers 431, 432, 433 and 434 may include, for example, oxide, nitride, oxynitride, and/or any combination thereof. The width of spacers 431, 432, 433 and 434 may be formed sufficiently wide so as to prevent silicided contacts, to be formed subsequently on the source/drain regions of gate devices 411 and 412, from encroaching underneath the edge of the patterned gate stacks. For example, spacers 431 and 432 may be formed around gate stack 421 to provide isolation between the gate electrode (to be formed later) of gate stack 421 and source/drain regions next to spacers 431 and 432 in device region 111. The same is true for spacers 433 and 434 formed around gate stack 422.

Following the formation of gate stacks 421 and 422 and surrounding spacers 431, 432, 433 and 434, source/drain diffusion regions, for example diffusion regions 441, 442, 443 and 444, may be formed through an ion implantation process. Gate stacks 421 and 422, together with surrounding spacers 431, 432, 433 and 434, may serve as implantation masks in the formation of source/drain diffusion regions 441, 442, 443 and 444. The ion implantation process may be followed immediately by an annealing process although the annealing process may be preferably performed at a later stage, after the removal of Ge-containing layer 311b of gate stack 422 as described below in detail, in order to avoid, eliminate, and/or minimize possible Ge diffusion into silicon layer 212b. The annealing step serves to activate the dopants that are implanted during the ion implantation step. Temperature conditions for ion implantation and annealing are well known to those skilled in the art and generally range from 900° C. to 1300° C. depending on the annealing tool and technologies used. Annealing temperatures in the 1000° C.-1100° C. for less than one (1) second are generally preferred.

Figure 5:
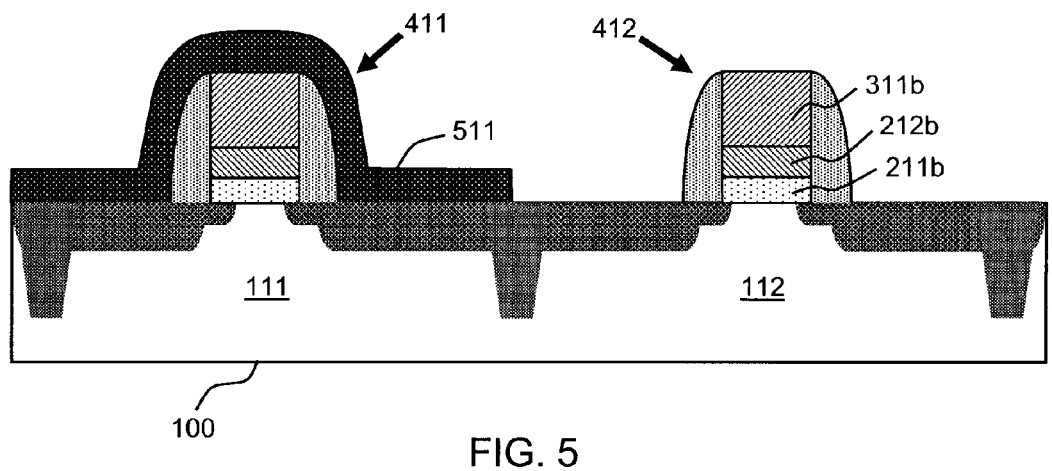

FIG. 5 is a simplified illustration of a method of selectively forming fully silicided gate electrodes according to one more embodiment of the invention. Following the formation of gate devices 411 and 412 as illustrated in FIG. 4, a protective masking layer 511, which may be a layer of silicon oxide or silicon oxynitride or other suitable material, may be deposited or formed to cover gate devices that are not intended to undergo or experience the FUSI process. In other words, conducting FUSI on such gate devices may create undesirable performances and in some cases may cause such devices to not function properly or not function at all. Such devices may include certain types of nFET gates with low threshold voltages. Certain type of pFET gates may also not be suitable for FUSI since their workfunction may be difficult to be modulated by a FUSI process.

Figure 6:
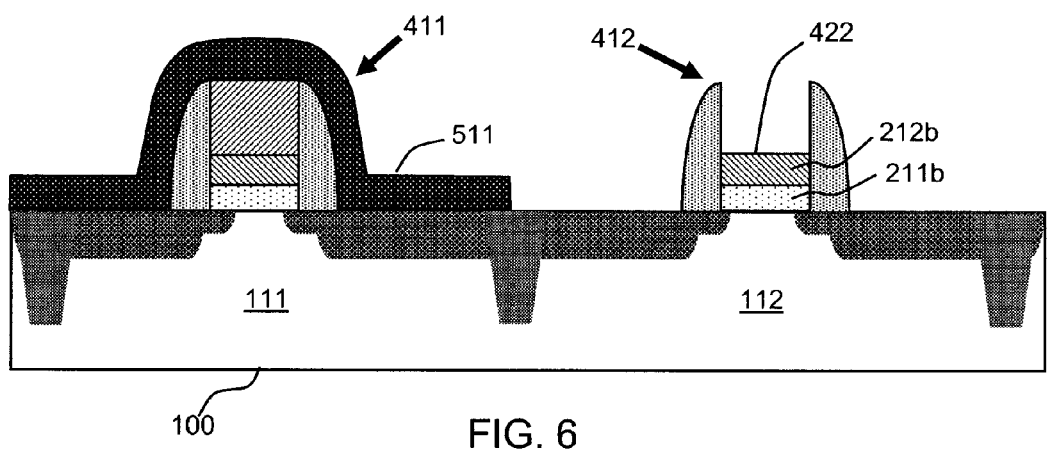

FIG. 6 is a simplified illustration of a method of selectively forming fully silicided gate electrode according to one further embodiment of the invention. Following the formation of protective masking layer 511 as illustrated in FIG. 5, Ge-containing silicon layer 311b in gate stack 422 of nFET gate 412 may be selectively removed through an etching process such as, for example, a RIE. Since gate device 411, which is a pFET gate, is protected by masking layer 511, the process of removing Ge-containing silicon layer 311b may not cause impact to structure and therefore performance of gate device 411. The removal of Ge-containing silicon layer 311b prepares gate device 412 for a further step of processing such as a fully silicidation processing.

After removing Ge-containing silicon layer 311b at the top of gate stack 422, substrate 100 may undergo an annealing process, if having not been thermally processed as described above with reference to FIG. 4 after the ion implantation or in addition to, to activate the ions implanted into source/drain diffusion regions 441, 442, 443 and 444. As described above, through performing the annealing process after the removal of Ge-containing silicon layer 311b, silicon layer 212b may be better controlled to have a thickness that is desirable for the full silicidation of silicon layer 212b, since there will be no Ge diffusion from Ge-containing layer 311b, which would occur otherwise should the annealing process takes place before Ge-containing layer 311b is removed.

After removing Ge-containing layer 311b and activating ions implanted in source/drain regions 441, 442, 443 and 444 through the annealing process, protective masking layer 511 may be selectively removed or lifted through, for example, a wet etching process although other removal processes may be used as well.

Figure 7:
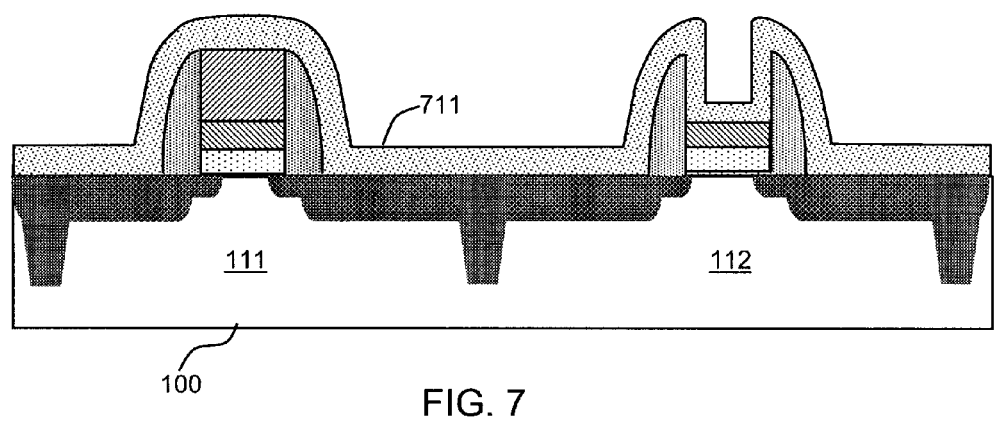

FIG. 7 is a simplified illustration of a method of selectively forming fully silicided gate electrodes according to yet one more embodiment of the invention. Following the removal of Ge-containing silicon layer 311b as shown in FIG. 6, a metal or metal-containing layer 711 may be deposited to cover the exposed silicon layer 212b of gate device or structure 412 and gate stack 421 of gate device or structure 411, among others. This metal or metal-containing layer 711 may be formed by applying one of the conventional deposition processes including, but not limited to, sputtering, plating, CVD, atomic layer deposition (ALD) or chemical solution deposition. Metal or metal-containing layer 711 may include at least one metal element capable of forming a metal silicide when being in contact with silicon and subjected to an annealing process. Suitable metals include, but are not limited to, Co, Ni, Ti, W, Mo, Ta, Pt, Er, Yb and alloys or multi-layers thereof. Preferred metals include Ni, Co and Ti, with Ni being highly preferred.

In one embodiment, metal-containing layer 711 used in forming a metal silicide may include at least one alloying additive in an amount of up to 50 atomic weight percent. The alloying additive, when present, may be formed at the same time as that of the metal-containing layer 711, or it may be introduced into an as-deposited metal-containing layer utilizing some well-known techniques such as, for example, ion implantation or gas phase doping. Examples of alloying additives may include C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu, Er and mixtures thereof. A person skilled in the art may appreciate that the above may not be an exclusive list of all the alloying additives and other additives may be used.

Figure 8:
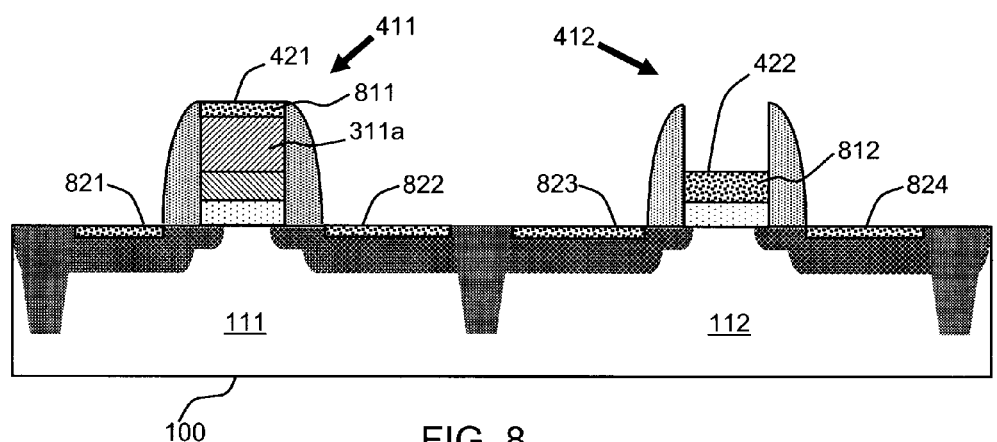

FIG. 8 is a simplified illustration of a method of selectively forming fully silicided gate electrodes according to an additional embodiment of the invention. Following the deposition of metal or metal-containing layer 711 as illustrated in FIG. 7, FUSI is performed on gate stack 422 to form electrode of gate device 412. The FUSI may be an annealing process conducted or performed in a high temperature environment typically from 400° to 900° C. In addition, the annealing process may be preferably conducted in a temperature range from about 420° to about 700° C. The annealing process may be conducted for various lengths of time depending on the type of annealing process used. For example, furnace annealing may be performed for longer lengths of time than are rapid thermal annealing, spike annealing or laser annealing. Typically, a rapid thermal annealing is performed for a time period of from about 1 to about 120 seconds. A person skilled in the art will understand that other temperatures and time periods may be employed so long as the conditions are capable of causing the formation of fully silicide gate electrode 812, which may be converted from silicon layer 212b (FIG. 6). The annealing process is typically carried out in a gas ambient that includes He, Ar, $N_2$ or a forming gas. As is illustrated in FIG. 8, source/drain regions of gate devices 411 and 412 are also silicided during the FUSI process of gate stack 422. For example, after the FUSI process, gate device 411 may include silicided source/drain regions 821 and 822, and gate device 412 may have silicided source/drain regions 823 and 824. However, according to one embodiment of the invention, only a portion of Ge-containing silicon layer 311a in gate device 411 is silicided to form a silicide 811. In other words, gate stack 421 is protected from full silicidation and FUSI is only performed on gate stack 422 of gate device 412.

Following FUSI on gate stack 422 of gate device 412, metal or metal-containing layer 711 may be removed by applying selective etching as is known in the art. The underlying gate devices or structures 411 and 412, with partially silicided gate stack 421 and fully silicidated gate stack 422 with FUSI electrode 812, and silicided source/drain regions 821, 822, 823, and 824 are then exposed. FUSI electrode 812 has a low profile of less electrode area. The thinner FUSI electrode may reduce possible sidewall parasitic capacitance.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method for selectively forming fully silicided (FUSI) gate electrode on gate dielectric, the method comprising:
    forming first and second sets of gate devices on a substrate;
    covering one or more of said first set of gate devices with a protective masking layer;
    removing selectively a Ge-containing silicon layer in a gate stack of one or more of said second set of gate devices to expose a silicon layer formed directly on top of a gate dielectric layer;
    removing said protective masking layer on said one or more of said first set of gate devices;
    covering said first set of gate devices and said second set of gate devices, including exposed said silicon layer, with a metal-containing layer; and
    annealing said first and second sets of gate devices to form selectively said FUSI gate electrode directly on top of said gate dielectric layer of said one or more of said second set of gate devices.

2. The method of claim 1, wherein forming selectively said FUSI gate electrode comprises converting said silicon layer, covered by said metal-containing layer, into said FUSI gate electrode.

3. The method of claim 2, wherein said annealing comprises subjecting said first and second sets of gate devices to a high temperature environment of about 400° C. to about 900° C., and preferably from about 420° C. to about 700° C.

4. The method of claim 3, wherein said annealing further comprises subjecting said first and second sets of gate devices to a gas ambient including He, Ar, or $N_2$, and to a process of rapid thermal annealing, spike annealing, or laser annealing in a time period from about 1 second to about 120 seconds.

5. The method of claim 4, wherein said silicon layer has a thickness in the range from about 10 nm to about 50 nm, and preferably between about 15 nm and about 30 nm.

6. The method of claim 1, wherein said first set of gate devices are p-type field-effect-transistors, and said second set of gate devices are n-type field-effect-transistors.

7. The method of claim 1, wherein said annealing said first and second sets of gate devices further comprises forming silicided source/drain regions of said first and second sets of gate devices.

8. The method of claim 7, wherein said annealing said first and second sets of gate devices further comprises siliciding at most a portion of a Ge-containing silicon layer in a gate stack of said one or more of said first set of gate devices.

9. The method of claim 1, wherein covering said first and second sets of gate devices with a metal-containing layer comprises depositing said metal-containing layer directly on top of said first set of gate devices and said second set of gate devices, including exposed said silicon layer, said metal-containing layer including at least one metal element capable of forming a metal silicide when being in contact with silicon and subjected to an annealing process.

10. The method of claim 9, wherein said at least one metal element is selected from the group of Ni, Co, and Ti, with Ni being preferable.

11. The method of claim 1, further comprising removing, after said annealing, said metal-containing layer using selective etching to expose said first and second sets of gate devices.

12. The method of claim 1, wherein said protective masking layer comprises a layer of silicon oxide or silicon oxynitride suitable for protecting said first set of gate devices in a process of removing selectively said Ge-containing silicon layer of said second set of gate devices.

13. The method of claim 1, further comprising, after removing selectively said Ge-containing layer, annealing said first and second sets of gate devices to activate ions implanted into source/drain regions thereof.

14. The method of claim 1, wherein forming said first and second sets of gate devices comprises producing gate stacks thereof, said gate stacks including said Ge-containing silicon layer suitable for a selective etching process.

15. The method of claim 14, wherein said Ge-containing silicon layer is a silicon alloy layer having a Ge concentration in the range of about 15 to about 50 atomic percentage, and preferably within a range of about 30 to about 40 atomic percentage.

16. The method of claim 14, wherein said Ge-containing silicon layer is a silicon alloy layer of single-crystal, amorphous, or polycrystalline, with polycrystalline being preferred.

17. The method of claim 14, wherein said Ge-containing silicon layer has a thickness between about 50 nm to about 100 nm with a preferred range of about 70 nm to about 85 nm.

18. A method for forming fully silicided (FUSI) gate electrode for one or more n-type FETs (field-effect-transistors) on a semiconductor substrate, said semiconductor substrate including one or more p-type FETs, the method comprising:
    covering said one or more p-type FETs with a protective masking layer;
    removing a Ge-containing silicon layer in a gate stack of said one or more n-type FETs to expose a silicon layer formed directly on top of a gate dielectric layer of said one or more n-type FETs;
    removing said protective masking layer on said one or more p-type FETs;
    covering said one or more p-type FETs and said one or more n-type FETs, including exposed said silicon layer of said one or more n-type FETs, with a metal-containing layer; and
    annealing said one or more p-type FETs and one or more n-type FETs to form selectively said FUSI gate electrode directly on top of said gate dielectric layer of said one or more n-type FETs.

19. The method of claim 18, wherein forming selectively said FUSI gate electrode comprises converting said silicon layer, covered by said metal-containing layer, into said FUSI gate electrode.

20. The method of claim 19, wherein said annealing comprises subjecting said one or more p-type and said one or more n-type FETs to a high temperature environment of about 400° C. to about 900° C., and preferably from about 420° C. to about 700° C. for a time period from about 1 second to about 120 seconds.

21. The method of claim 20, wherein said annealing further comprises subjecting said one or more p-type and said one or more n-type FETs to a gas ambient including He, Ar, or $N_2$ in a process of rapid thermal annealing, spike annealing, or laser annealing.

22. The method of claim 18, wherein said silicon layer has a thickness in the range from about 10 nm to about 50 nm, and preferably between about 15 nm and about 30 nm.

23. The method of claim 18, wherein annealing said one or more p-type and said one or more n-type FETs further comprises forming silicided source/drain regions of said one or more p-type and said one or more n-type FETs, and siliciding a portion of a Ge-containing silicon layer in a gate stack of said one or more p-type FETs.

24. The method of claim 18, wherein said metal-containing layer including at least one metal element capable of forming a metal silicide when being in contact with silicon and subjected to an annealing process, and is selected from the group of Ni, Co, and Ti, with Ni being preferable.

25. The method of claim 18, wherein said protective masking layer comprises a layer of silicon oxide or silicon oxynitride suitable for protecting said one or more p-type FETs in a process of removing selectively said Ge-containing silicon layer of said one or more n-type FETs.

26. The method of claim 18, wherein said Ge-containing silicon layer is a silicon alloy layer having a Ge concentration in the range of about 15 to about 50 atomic percentage, and preferably within a range of about 30 to about 40 atomic percentage.

27. The method of claim 18, wherein said Ge-containing silicon layer has a thickness between about 50 nm to about 100 nm with a preferred range of about 70 nm to about 85 nm.

* * * * *